(12) United States Patent
Iotov et al.

(10) Patent No.: US 8,161,469 B1
(45) Date of Patent: Apr. 17, 2012

(54) METHOD AND APPARATUS FOR COMPARING PROGRAMMABLE LOGIC DEVICE CONFIGURATIONS

(75) Inventors: Mihail Iotov, San Jose, CA (US); Erhard Joachim Pistorius, Milpitas, CA (US); Jim Park, San Jose, CA (US); David Karchmer, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 1191 days.

(21) Appl. No.: 11/302,568

(22) Filed: Dec. 13, 2005

(51) Int. Cl.
*G06F 9/45* (2006.01)

(52) U.S. Cl. ........................ 717/144; 717/126

(58) Field of Classification Search ............... 717/140, 717/139; 707/6
See application file for complete search history.

(56) References Cited

U.S. PATENT DOCUMENTS

| | | | | |
|---|---|---|---|---|
| 4,758,953 A * | 7/1988 | Morita et al. | | 716/1 |
| 5,068,603 A * | 11/1991 | Mahoney | | 714/726 |
| 5,425,036 A * | 6/1995 | Liu et al. | | 714/735 |
| 5,457,408 A * | 10/1995 | Leung | | 326/38 |
| 5,521,837 A * | 5/1996 | Frankle et al. | | 716/10 |
| 5,526,278 A * | 6/1996 | Powell | | 716/16 |
| 5,633,813 A * | 5/1997 | Srinivasan | | 703/14 |
| 5,768,288 A * | 6/1998 | Jones | | 714/725 |
| 5,768,562 A * | 6/1998 | Heile et al. | | 717/168 |
| 5,804,960 A * | 9/1998 | El Ayat et al. | | 324/158.1 |
| 5,815,405 A * | 9/1998 | Baxter | | 716/3 |
| 5,943,488 A * | 8/1999 | Raza | | 716/19 |
| 5,974,254 A * | 10/1999 | Hsu | | 717/109 |
| 6,075,932 A * | 6/2000 | Khouja et al. | | 716/4 |
| 6,167,364 A * | 12/2000 | Stellenberg et al. | | 703/19 |
| 6,407,576 B1 * | 6/2002 | Ngai et al. | | 326/41 |
| 6,438,738 B1 * | 8/2002 | Elayda | | 716/16 |
| 6,502,112 B1 * | 12/2002 | Baisley | | 715/210 |
| 6,601,024 B1 * | 7/2003 | Chonnad et al. | | 703/14 |
| 6,625,788 B1 * | 9/2003 | Vashi et al. | | 716/6 |
| 6,651,186 B1 * | 11/2003 | Schwabe | | 714/38 |
| 6,658,626 B1 * | 12/2003 | Aiken | | 715/205 |
| 6,662,323 B1 * | 12/2003 | Ashar et al. | | 714/724 |
| 6,883,087 B1 * | 4/2005 | Raynaud-Richard et al. | | 712/213 |
| 6,988,258 B2 * | 1/2006 | Tan et al. | | 716/17 |
| 7,020,855 B2 * | 3/2006 | Wallace | | 716/107 |
| 7,038,490 B1 * | 5/2006 | Singh et al. | | 326/41 |
| 7,089,530 B1 * | 8/2006 | Dardinski et al. | | 717/105 |
| 7,216,318 B1 * | 5/2007 | Siarkowski | | 716/6 |
| 7,310,794 B1 * | 12/2007 | Squires | | 716/16 |

(Continued)

OTHER PUBLICATIONS

Fiance, Lonn and Valleunga, Robert "Complex FPGAs Require Equivalence Checking" Xcell Journal Second Quarter 2005 (Jun. 2005).*

*Primary Examiner* — Tuan Dam
*Assistant Examiner* — Samuel Hayim
(74) *Attorney, Agent, or Firm* — Ropes & Gray LLP; Jeffrey H. Ingerman

(57) ABSTRACT

Compiled configuration files for different programmable logic devices that are intended to be functionally equivalent may be compared using multiple different comparisons to assure functional equivalence. The different comparisons include a fitter or resource report comparison, an engineering bit settings report that compares vectors of bits that represent the settings of hard logic blocks, and comparisons based on location, connectivity and functionality. These comparisons are particularly well-suited for determining equivalence between different models of programmable logic devices, or even different types of devices such as field-programmable gate arrays as compared to mask-programmable logic devices.

43 Claims, 8 Drawing Sheets

U.S. PATENT DOCUMENTS

| | | |
|---|---|---|
| 7,358,766 B2 * | 4/2008 | Lawson et al. ............... 326/41 |
| 7,464,362 B1 * | 12/2008 | Borer et al. ................. 716/18 |
| 7,577,929 B1 * | 8/2009 | Hutton et al. ................ 716/5 |
| 7,669,157 B1 * | 2/2010 | Borer et al. .................. 716/7 |
| 2002/0078266 A1 * | 6/2002 | Watanabe et al. ............ 710/8 |
| 2003/0071654 A1 * | 4/2003 | Schleicher et al. .......... 326/41 |
| 2003/0200520 A1 * | 10/2003 | Huggins et al. ............. 716/16 |
| 2004/0015901 A1 * | 1/2004 | Koseki et al. ............... 717/140 |
| 2004/0034849 A1 * | 2/2004 | Cohen et al. ................ 717/120 |
| 2004/0088622 A1 * | 5/2004 | Graham et al. .............. 714/736 |
| 2004/0098420 A1 * | 5/2004 | Peng .......................... 707/203 |
| 2004/0210551 A1 * | 10/2004 | Jones et al. ................... 707/1 |
| 2005/0014559 A1 * | 1/2005 | Mattice et al. ............... 463/29 |
| 2006/0197552 A1 * | 9/2006 | Lawson et al. .............. 326/38 |
| 2006/0236293 A1 * | 10/2006 | Park et al. ................... 716/17 |

\* cited by examiner

<-- 30

| NAME | PIN # | I/O BANK | CURRENT STRENGTH | TERMINATION | LOCATION ASSIGNED BY | LOAD |
|---|---|---|---|---|---|---|
| ad[33] | X984_Y12_N0 | 12 | 2mA | OFF | USER | 0 pF |
| irdyn | X984_Y1582_N0 | 11 | 24mA | OFF | USER | 0 pF |
| par | X929_Y1582_N0 | 12 | 24mA | OFF | USER | 0 pF |
| s_dq[48] | X888_Y12_N0 | 8 | 12mA | OFF | USER | 0 pF |

| NAME | PIN # | I/O BANK | CURRENT STRENGTH | TERMINATION | LOCATION ASSIGNED BY | LOAD |
|---|---|---|---|---|---|---|
| ad[33] | X984_Y12_N0 | 8 | 12mA | OFF | USER | 0 pF |
| irdyn | X984_Y1582_N0 | 3 | 24mA | OFF | USER | 0 pF |
| par | X929_Y1582_N0 | 3 | 24mA | OFF | USER | 0 pF |
| s_dq[48] | X888_Y12_N0 | 8 | 12mA | OFF | USER | 0 pF |

| PIN NAME | PIN PROPERTY | HARDCOPY II (alt_pci_mt64_hcii) VALUE | STRATIX II (alt_pci_mt64) VALUE |
|---|---|---|---|
| ad[33] | I/O BANK | 8 | 12 |
| irdyn | I/O BANK | 3 | 11 |
| par | CURRENT STRENGTH | 12 | 2 |
| s_dq[48] | I/O BANK | 8 | 12 |

*FIG. 5*

METHOD AND APPARATUS FOR COMPARING PROGRAMMABLE LOGIC DEVICE CONFIGURATIONS

BACKGROUND OF THE INVENTION

This invention relates to the comparison of programmable logic device (PLD) configurations. More particularly, this invention relates to such comparisons for assuring functional equivalence between configurations of different types of PLDs.

Programmable logic devices are well-known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements each time that the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic elements in the device, and the interconnect for routing of signals between the logic elements, were programmable. More recently, mask-programmable logic devices (MPLDs) have been provided. With mask-programmable logic devices, instead of selling all users the same device, the manufacturer manufactures a partial device with a standardized arrangement of logic elements whose functions are not programmable by the user, and which lacks any routing or interconnect resources.

The user provides the manufacturer of the mask-programmable logic device with the specifications of a desired device, which may be the configuration file for programming a comparable conventional programmable logic device. More recently, software has become available that allows direct creation of a configuration file for the mask-programmable logic device. In any event, the manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

Although with the simplest early programmable logic devices, it may have been possible to lay out a logic design by hand, it has been traditional to use software tools provided by the programmable logic device manufacturer or by third parties to program programmable logic devices. Contemporary programmable logic devices have become so complex that programming a device without such software tools is at best impractical.

The number of different programmable logic devices has proliferated. A single manufacturer might provide several different types of devices, and within a type several families of devices, and within a family several devices of different sizes having more or fewer features. A user may want to incorporate different programmable logic devices into different products or uses, but perform similar functions. Thus, a manufacturer of cellular telephones may provide telephone models of different prices and feature complexity. Among the components of such telephones may be programmed programmable logic devices. The telephone manufacturer's different models, having different prices, may incorporate different models of programmable logic devices that reflect the prices and features sets of the telephones. Nevertheless, for certain features, the telephone manufacturer may have proven certain programmable logic device programming and would like to use that programming in all of its telephones to the extent possible.

There may be other reasons why a user would want to use different versions of the same programming. For example, a user may have a working design for a particular programmable logic device, but may prototype additional features in a test program for the same programmable logic device. Once that test program has been proven, the user will want to migrate those features into the existing design. Or the user might want to optimize settings of the programming tool, without making any actual logical changes, to see if the programming tool can be made to provide a more efficient programming file.

Alternatively, a user may want to copy a design from a more complex programmable logic device into a smaller programmable logic device of the same family, to use, e.g., in a less expensive version of the same product. Or the user may want to migrate the design to a completely different programmable logic device family. For example, for cost reduction, the user may want to shift some of its production into mask-programmable devices. Certain mask-programmable devices are virtually identical to the conventional programmable logic devices to which they correspond, while others, such as that described in commonly-assigned U.S. patent application Ser. No. 10/316,237, filed Dec. 9, 2002 and now U.S. Pat. No. 6,988,258, which is hereby incorporated herein by reference in its entirety, includes a plurality of more elementary logic areas that can be connected together to provide the functionality of a corresponding conventional programmable logic device. Either way, there will be differences (fewer or more, respectively) between the programming for a conventional programmable logic device and a corresponding mask-programmable logic device.

The user programming for each of these devices may be entered by the user in one or both of (a) a file, such as a hardware description language file, describing the logical behavior of the device, and (b) a file of settings for the programming tool. The combination of one or both of those files may be referred to as a "user configuration dataset." Commonly-assigned U.S. patent application Ser. No. 11/108,370, filed Apr. 18, 2005, now U.S. Pat. No. 7,277,902, which is hereby incorporated by reference in its entirety, describes the comparison of different user configuration datasets for a device, resulting in the presentation to the user of a representation of any differences between the user configuration datasets. The user also may be presented with suggestions for resolving any differences between the different user configuration datasets.

However, even if differences between the user configuration datasets are resolved, the actual programming of the devices is accomplished by compiling those user configuration datasets into configuration files, which may be embodied as a bitstream or database reflecting a netlist of elements. While it is known to compare different configuration files by comparing ("verifying") those netlists, known comparison techniques may not be sufficient.

For example, programmable logic devices frequently include embedded blocks that are preconfigured for certain functions such as memory, phase-locked loops, etc., whose characteristics are programmed by configuration bits. Known formal verification techniques treat those preconfigured blocks as blocks, with no regard to how they are implemented, even though differences internal to such blocks may have significance. Similarly, formal verification techniques do not account for placement differences that may have significance, or to electrical differences, such as drive strength differences, that may have significance. These differences are exacerbated when comparing different classes of programmable logic device, such as comparing a field programmable gate array to an equivalent mask-programmable logic device.

It would be desirable to be able to make a functional comparison between the programming of different programmable logic devices.

SUMMARY OF THE INVENTION

The present invention provides a functional comparison of the compiled programming files of different programmable logic devices, particularly when the programmed devices are supposed to be functionally identical. The functional comparison is accomplished by making several different types of comparison. The order in which the comparisons are discussed is not indicative of the order in which they are carried out, which is not significant. Moreover, not all of these comparisons would necessarily be made in every case.

One comparison that may be made is a fitter report, or resource report, comparison. A fitter or resource report may be generated for each device listing, for example, each input/output (I/O) signal, its pin and I/O bank assignments, its drive current, etc. A comparison report may take the form of a table listing those resources that do not match.

Another comparison that may be made is an assembler report, or engineering bit settings report. As discussed above, certain hard logic blocks may be controlled by engineering bit settings—a subset of the configuration bits. This comparison identifies the engineering bit settings for each device as compiled, and lists any differences between the engineering bit settings for the different devices. These are generally parts of the design to which the user has no direct access, so ordinarily they will not be represented in a conventional netlist. The bit settings report takes the place of a netlist representation by representing the vector of memory bits corresponding to certain components—e.g., multiplexers—that control data flow between various parts of the design. Even though the user has no access to those parts of the design, the vectors can be compared, and a report for the user prepared.

Other comparisons that may be made (and reports prepared), are comparisons based on location, connectivity and functionality. As a first stage, the two netlists are matched by identifying the blocks that correspond to each other, and a mapping is set between them. Blocks that cannot be matched may be reported. Different methods of block matching may be used. For example, matching may be performed based on block names, connectivity or a combination of names and connectivity. As another example, matching can be accomplished based on physical locations, such as proximity or connectivity to certain pins which share physical locations in both devices (as they normally would for pin-compatibility).

Because the comparison is performed on programming files that have already been compiled, there is no opportunity for automatic resolution of any conflicts or differences that may be found. Instead, any such conflicts or differences that may be found can only be reported to the user for review, and for any action that may be necessary.

Thus, in accordance with the present invention there is provided a method of comparing compiled programming files for different programmable logic devices. The method includes identifying functional features in each respective one of the programming files, establishing correspondence between one or more functional features in one of the programming files and one or more functional features in another of the programming files, and comparing each of one or more of functional features in said one of said programming files to a corresponding functional feature in said another of said programming files. A programmable logic device whose programming has been verified in accordance with the method is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 3 is an example of a resource report for the compilation of a user design in a conventional programmable logic device;

FIG. 4 is an example of a resource report for the compilation of a user design in a mask-programmable logic device;

FIG. 5 is an example of report comparing the reports of FIGS. 3 and 4;

DETAILED DESCRIPTION OF THE INVENTION

The present invention provides a functional comparison of the compiled programming files of different programmable logic devices. The invention is particularly useful when the programmed devices are supposed to be functionally identical. However, the invention also may be useful when the devices are supposed to be merely similar, to allow verification that the portions that are supposed to be identical are in fact identical, even while other portions differ. The functional comparison is accomplished by making several different types of comparison. The order in which the comparisons are discussed is not indicative of the order in which they are carried out, which is not significant. Moreover, not all of these comparisons would necessarily be made in every case.

One comparison that may be made is a fitter report, or resource report, comparison. A fitter or resource report may be generated for each device listing, for example, each input/output (I/O) signal, its pin and I/O bank assignments, its drive current, etc. A comparison report may take the form of a table listing those characteristics of identical signals that do not match.

Another comparison that may be made is an assembler report, or engineering bit settings report. As discussed above, certain hard logic blocks may be controlled by engineering bit settings. This comparison identifies the engineering bit settings for each device as compiled, and lists any differences between the engineering bit settings for the different devices. These are generally parts of the design to which the user has no direct access, so ordinarily they will not be represented in a conventional netlist. The bit settings report takes the place of a netlist representation by representing the vector of memory bits corresponding to certain components—e.g., multiplexers—that control data flow between various parts of the design. Even though the user has no access to those parts of the design, the vectors can be compared, and a report for the user prepared.

Other comparisons that may be made (and reports prepared), are comparisons based on location, connectivity and functionality. As a first stage, the two netlists are matched by identifying the blocks that correspond to each other, and a mapping is set between them. Blocks that cannot be matched are reported. Different methods of block matching may be used. For example, matching may be performed based on block names, connectivity or a combination of names and connectivity. As another example, matching can be accomplished based on physical locations, such as proximity or connectivity to certain pins which share physical locations in both devices (as they normally would for pin-compatibility).

The invention will now be described with reference to FIGS. 1-8.

Figure 1:
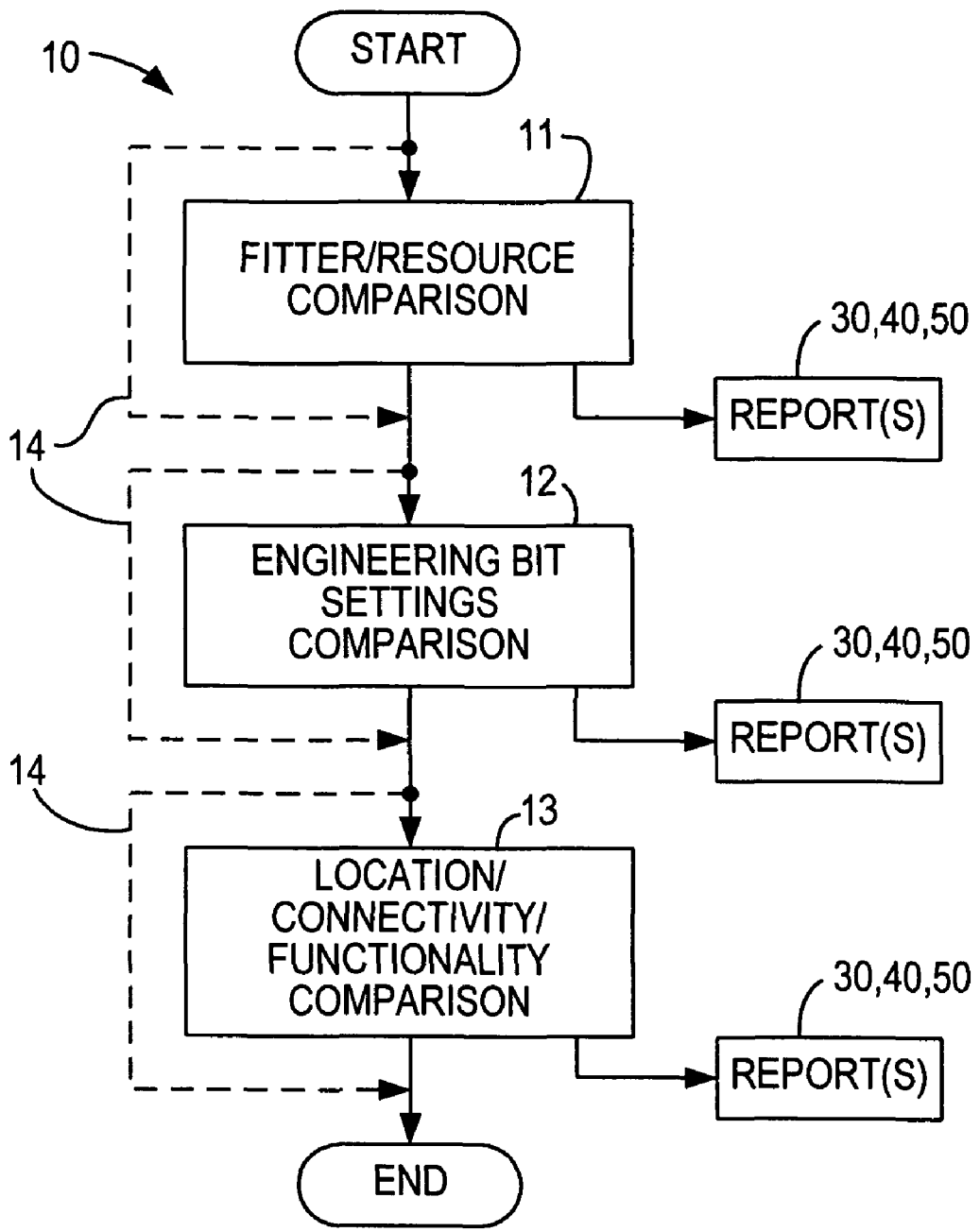
FIG. 1 is a flow diagram of a preferred embodiment of the method according to the present invention.
Figure 2:
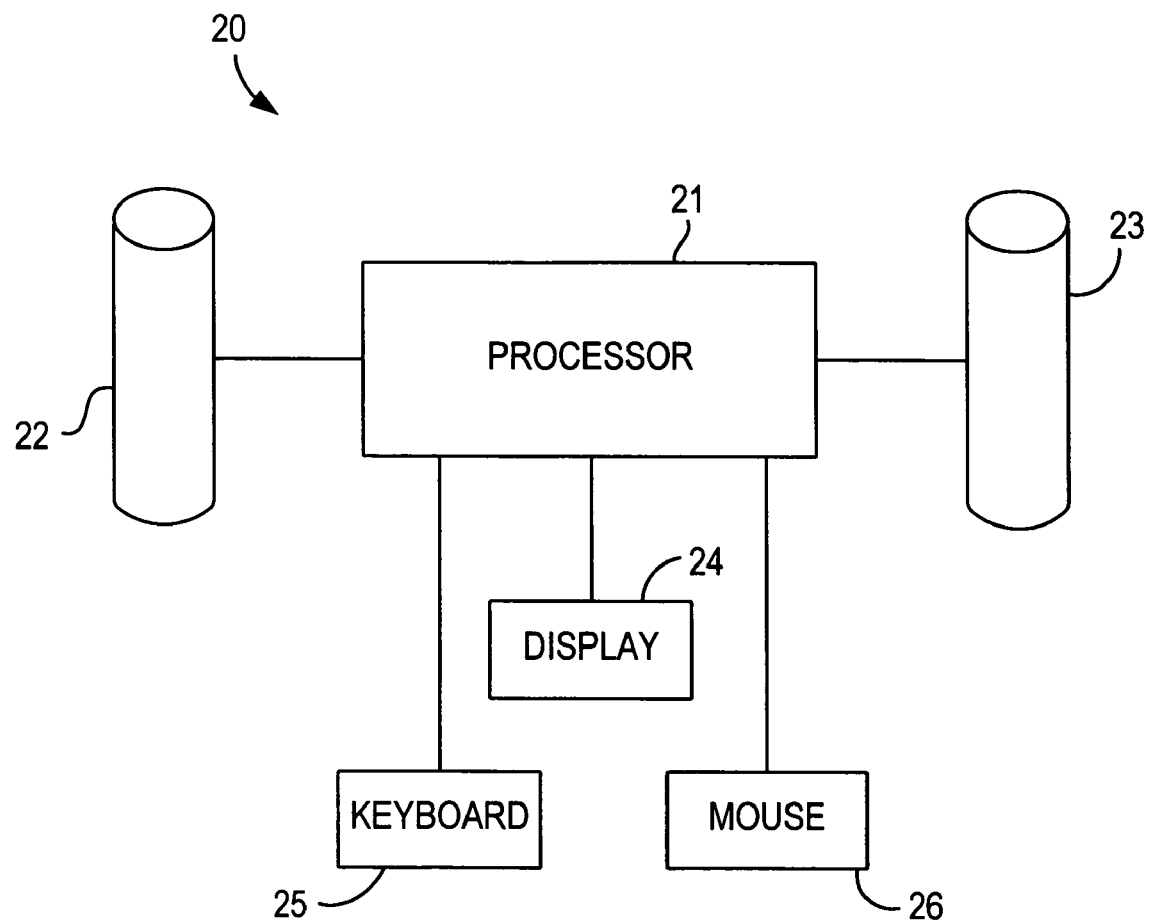
FIG. 2 is a schematic diagram of a preferred embodiment of apparatus according to the present invention for performing the method of FIG. 1.
Figure 6:
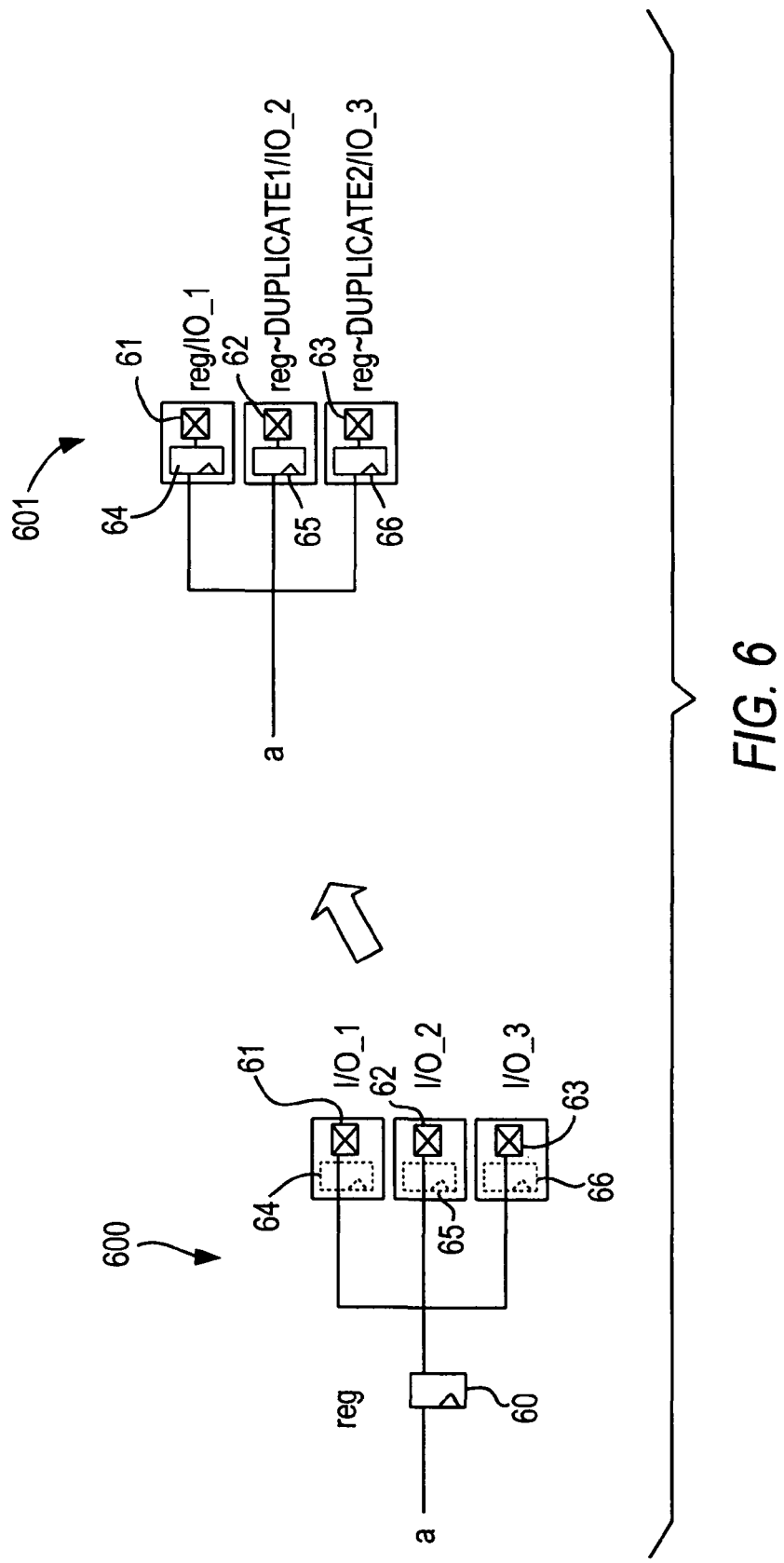
FIG. 6 shows an example of register packing.

As discussed above, the method according to the present may perform several different types of comparisons of the compiled configuration files of the two programmed programmable logic devices that are being compared. FIG. 1 is a flow diagram showing one embodiment 10 of the method. FIG. 2 is a schematic diagram of apparatus 20 on which method 10 may be performed. Thus, processor 21 preferably at step 11 reads an origin file, representing a programmable logic device design that is appropriate for a first type of programmable logic user configuration dataset and that has been revised by a user, from storage device 22, which may be a conventional hard disk drive or any other suitable storage technology In method 10, first a comparison 11 is performed, preferably by processor 21, between the resource report for each of the two compiled configurations, which may be read, for example, from mass storage devices 22, 23. Next a comparison 12 is performed, again preferably by processor 21, between the engineering bit settings of the two compiled configurations. Finally, a comparison 13 is performed, again preferably by processor 21, based on location, connectivity and/or functionality.

It should be noted that the order of comparisons 11, 12, 13 is not important and comparisons 11, 12, 13 could be performed in a different order than that shown in FIG. 1 and nevertheless be within the present invention. In addition, it is within the present invention to perform only a subset of comparisons 11, 12, 13. This is indicated in FIG. 1 by the dashed bypass paths 14 around each of comparisons 11, 12, 13.

FIGS. 3-5 shows a sample result of a comparison 11 (resource report). FIG. 3 shows a resource report 30 for one of the devices being compared, while FIG. 4 shows a resource report 40 for the other of the devices being compared. In this example, resource report 30 is a portion of a resource report for compilation of a particular user logic design in a Stratix® II conventional programmable logic device (FPGA) available from Altera Corporation, of San Jose, Calif., while resource report 40 is a corresponding portion of a resource report for compilation of the same user logic design in a HardCopy® II mask-programmable logic device available from Altera Corporation. The comparison report 50 shows only the differences between reports 30 and 40. Preferably, only report 50 is displayed to the user, at least initially, preferably on display 24, to indicate the differences between the two compiled devices. This allows the user to determine if the differences can be ignored, or are real and significant—and how to resolve them if they are. Action can be taken by the user, if appropriate, using input devices such as keyboard 25 or mouse 26.

In certain preconfigured logic portions of a programmable logic device, the user has no direct access to the logic, which is controlled by a number of multiplexers. Neither the preconfigured logic itself nor multiplexer settings are represented in the database netlist, and therefore would not ordinarily show up in the compiler resource tables discussed above in connection with comparison 11 (FIGS. 3-5). In accordance with the present invention, comparison 12 examines and compares the bit settings that control the multiplexers. In a preferred embodiment, for compatibility with the other comparisons performed in accordance with the invention, including consistency of presentation to user, tables representing those multiplexer configuration settings preferably are created, similar to the table discussed in connection with comparison 11. Those tables can be compared in way similar to the way the compiler resource tables are compared.

In essence, this is a netlist representation in the form of a vector of memory bits corresponding to certain multiplexers, which control data flow between preconfigured parts of the device. An example of a function controlled by such configuration bits is a phased-lock loop (PLL) lock window, which may be an algorithmic function of other properties of the design (e.g., PLL frequency). As such, it is not normally represented directly on the netlist, but rather is preferably computed by the assembler during generation of a settings file from the user configuration database. In accordance with the present invention, those bits preferably are selectively copied from the configuration bitstream (most of the other bits need not be copied because they are already represented in the logical database or the resource comparison).

A third type of comparison 13 preferably actually shows if the functionality of the two devices being compared will be the same. Comparison 13 preferably is based on location, connectivity and/or functionality. As a first stage, netlist matching preferably is implemented in which the two netlists—for the two devices—are examined so that blocks that correspond to one another can be identified and maps set between them. Blocks that cannot be matched preferably are reported as such.

Different methods of block matching may be used to determine correspondence between blocks. One method uses names. This is fairly reliable if the two devices are programmed using substantially the same software. Some device vendors may provide the user with the ability to "patch" designs that need minor changes rather than completely recompile the design. Such patches may be referred to as "engineering change orders," and may allow a user to assign any desired name to a block. That ability may make block matching based on names less reliable. However, reliability may be increased by encouraging users to use standard block names.

Another method of matching preferably uses netlist connectivity. Matching by connectivity needs the identification of some key anchor points that always match. This can be by either location (e.g. pins), by name (e.g. certain macro blocks that are the same in both implementations and always have the same name), by other means (e.g. memory blocks with same size in both implementations) or by any combination of these. Starting from those anchor points, one can traverse the netlist backwards and forwards identifying matching pairs of blocks along the way.

Several different methods can be used in case of ambiguity. The easiest is simply to report unmapped blocks to the user. More elaborate methods include the definition of naming rules and conventions that enable the identification of blocks with similar names after the selection of candidates has been narrowed down. Another more complex and runtime-expensive method (functionality method) could be to keep a list of ambiguous points, determine the functionality of each one's input and match them after having compared their connectivity and functionality. Those methods also can be combined or variations of them can be used—e.g., the name matching rules could be used first, the functionality method could be used on the nodes that could not be matched based on names (but its application could be limited to, e.g., four ambiguous nodes at a time), and all other blocks could be reported as not matching. Another possibility is the iterative use of the same method—e.g., key anchor points could be defined, and until a stop criterion is reached (until a fixed number of iterations is reached or the matching rate is above a certain percentage of total blocks) one could traverse the netlist from those key anchor points forward and backward, match blocks along the way, resolving ambiguities by naming rule, and adding the newly matched blocks to the key anchor points. At the end of the day, any unmapped blocks are simply reported.

In addition to block matching, preferably wire matching also may be performed. Matched wires preferably may be used at several instances throughout the comparison process. However, unmatched wires preferably are not reported as are unmatched combinational logic blocks. The reason that these need not be reported is that two different implementations of a design are considered to be the same if all their sequential blocks can be matched and behave in a similar way (i.e., if one excludes optimizations such as NOT gate push-backs through registers, register duplication, duplicate register removal, optimization of stuck-at registers or others). However, the design is still functionally equivalent if a path contains, e.g., three inverters in one implementation of the design and one inverter in the other implementation of that same design, even though two inverters from the first implementation would not match with any combinational gate in the second implementation. Therefore, only unmatched sequential blocks are reported.

The netlist comparison preferably keeps track of every block that has been compared. Blocks that have not been covered by the comparison preferably are reported as such. Provided that every sequential point in the netlist has been mapped and the verification reveals that the input functions on those nodes are equivalent, then uncompared logic likely will not change the functionality of the netlist. However, information about uncompared logic blocks may provide valuable information about a design implementation, such as inefficiencies in the design, to the user. And in a case where functional non-equivalence between the two devices is reported, information about uncompared logic blocks may provide valuable information about where to start looking for causes of the non-equivalence.

The connectivity check preferably is performed for every mapped block. A traversal preferably is performed from the inputs (fan-in comparison) as well as from the outputs (fan-out comparison) of the mapped block in both netlists. The traversal preferably stops when it reaches other mapped blocks. Preferably, after the two traversals, the blocks mapped along the way are compared. Preferably, the fan-in comparison for all blocks except for the combinational blocks is performed on a port-by-port basis. However, for a combinational gate such as a three-input AND gate that could be mapped between the two implementations, it is irrelevant whether a certain signal is connected to port A, B or C. What is important is that the two AND gates both do have the same fan-in. That fan-in comparison itself is done by traversing the netlist backwards on all inputs of the matching block until reaching another matching block. That block is added to the compared block's support set. After the support sets for both mapped combinational blocks has been determined, they are compared to see whether or not they contain the same blocks. If they do, the fan-in is considered to be identical, notwithstanding the lack of port-by-port identity.

An important point to note in connection with the connectivity comparison is that an input port that is (a) unconnected, (b) connected to VCC or GND (whichever is the inactive level), or (c) connected to combinational logic implementing constant VCC or GND (whichever is the inactive level), is considered to be functionally the same. Therefore, the connectivity preferably is not reported as being different. However, an option to report those differences may be provided to the user.

Similarly, there may be a certain tolerance in the comparison, requiring a certain minimum degree of difference before a property or feature that is not the same is reported as being different. This is particularly the case where what is being compared includes electrical properties (as opposed, e.g., to a structural feature, where there is no degree of difference). Again, an option to report differences to the user even when they are within tolerance may be provided.

The invention preferably recognizes equivalence in the case of "register packing." This is a procedure where a register can be packed together with a certain look-up table (LUT) that is not the driver of that register into one logic element when certain conditions are met. Thus, in implementation 600 in FIG. 6, register 60 feeds three different LUTs 61, 62, 63. As shown in implementation 601 in FIG. 6, that arrangement can be implemented as three separate registers 64, 65, 66, feeding LUTs 61, 62, 63, respectively. The "packing" of registers 64, 65, 66 into LUTs 61, 62, 63 in implementation 601 is shown in phantom in implementation 600. Registers that are packed in one compiled implementation targeting a certain device family, but not packed in the other compiled implementation targeting the same or a different device family, are not reported as being different.

Once the mapping has been completed, functional comparison preferably is conducted only for mapped blocks that have the same connectivity. Those blocks may be sequential or combinational logic blocks. Preferably, there is a distinction between the functional comparison of sequential logic blocks and combinational logic blocks. For sequential logic blocks, the input functionality of every port preferably is compared, while for combinational logic blocks, preferably only the output functions realized by the respective blocks are compared.

Performing a functional comparison for combinational logic blocks is similar to partitioning the combinational logic cone between sequential comparison points. This can speed up the comparison process significantly, because the size of each functional comparison itself is significantly reduced.

Figure 7:
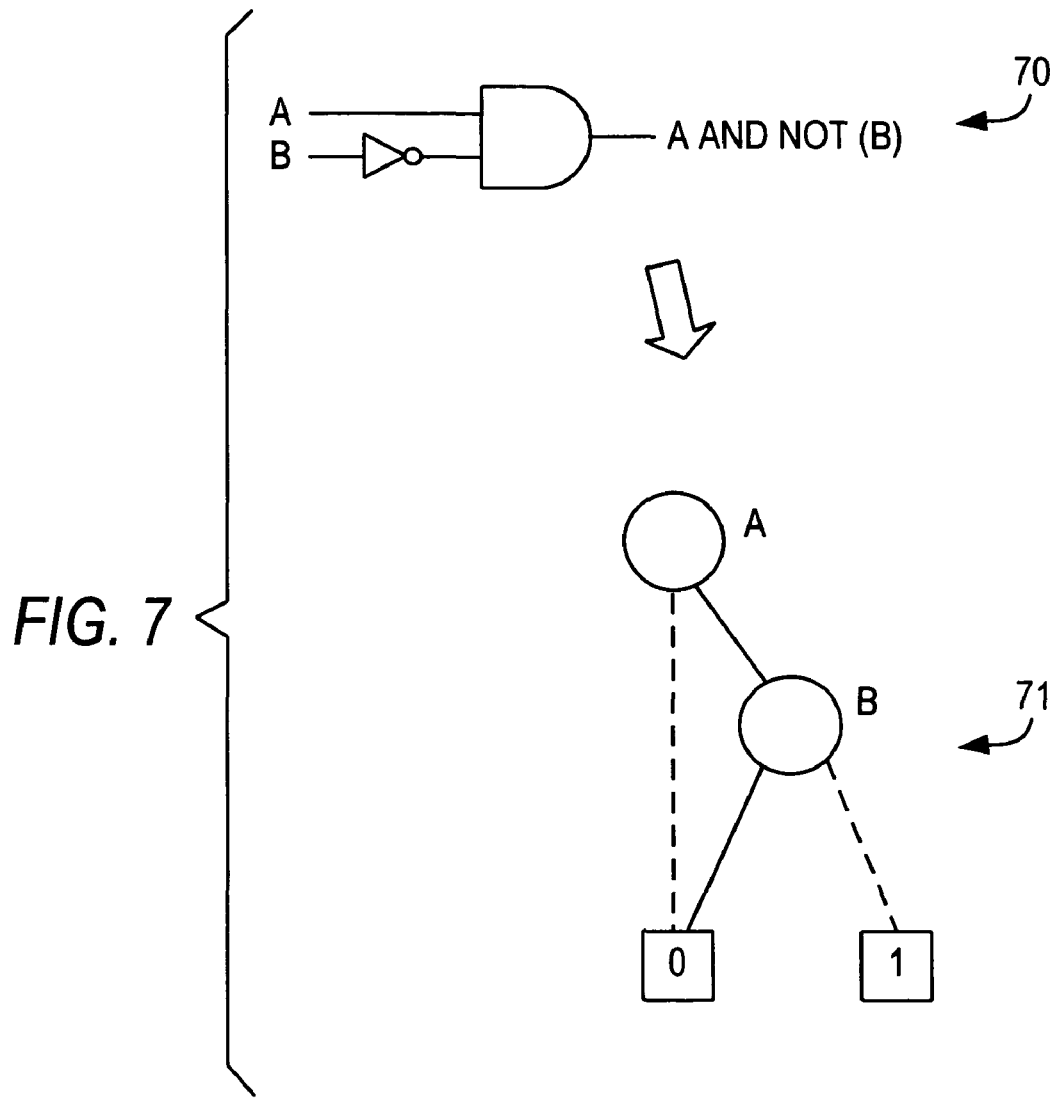
FIG. 7 is an example of the mapping of a first logic function onto a binary decision diagram.
Figure 8:
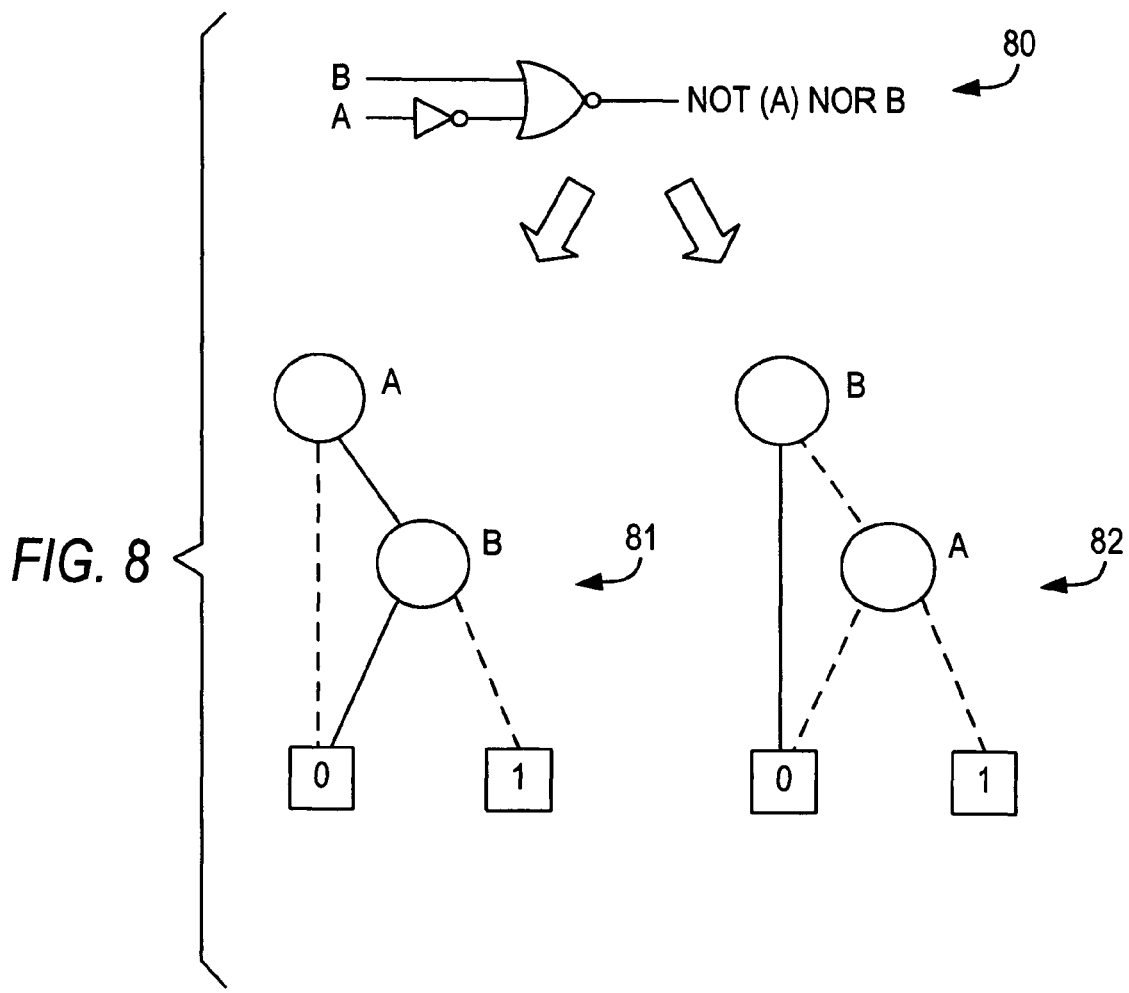
FIG. 8 is an example of the mapping of a second logic function onto two different binary decision diagrams.

The functional comparison procedure preferably is based on the construction of binary decision diagrams (BDDs). For each block in the two netlists, the matched wires in the fan-in set preferably are put in the same order. Those wires are equated to the variables of the BDDs. FIG. 7 shows the mapping of the logic function 70 "A AND NOT(B)" to a BDD 71. FIG. 8 shows the mapping of the logic function 80 (NOT (A)) NOR B to two different BDDs 81 and 82. A dashed line represents 0, while a solid line represents 1. All three BDDs represent equivalent logic, but while BDDs 71 and 81 are isomorphic, BDD 82 is not isomorphic with either BDD 71 or 81. Because when the comparison is made there is no way to perform a functional comparison, preferably, the functionality of the blocks is considered the same if and only if the two BDDs are isomorphic. Alternatively, there may be other ways of comparing the functionality of two blocks, such as techniques based on Boolean satisfiability (SAT) or automatic test pattern generation (ATPG). In addition, the user could be offered the option of comparing the equivalence of combinational logic that is limited by matching sequential blocks, as is done in known comparison methods.

Resources to be compared typically are represented by data objects or structures each of which contains up to hundreds of properties stored as (name, value) pairs. Any data structure may be a hierarchical structure that includes both (name, value) pairs and additional data structures. Resource comparisons in accordance with the invention preferably are performed recursively (except for objects flagged as non-essential, such as delay chains). After initializing the maps between the two netlists, as described above, the invention preferably iterates over all of the blocks of the first netlist. For each block that has a matching block in the second netlist, the invention preferably iterates over all data fields, comparing their values. If a field includes another structure, the fields within that structure are analyzed and then the first structure is returned to. This continues until no additional nested structures are found, and all objects have been reduced to (name, value) pairs which can be compared.

When a value is found to be different as between the two implementations being compared, a reporting criterion is applied to determine if the discrepancy should be reported. The criterion preferably normally defaults to true—i.e., report, but reporting may be suppressed for certain fields that are deemed inessential for the functionality of the block.

Figure 9:
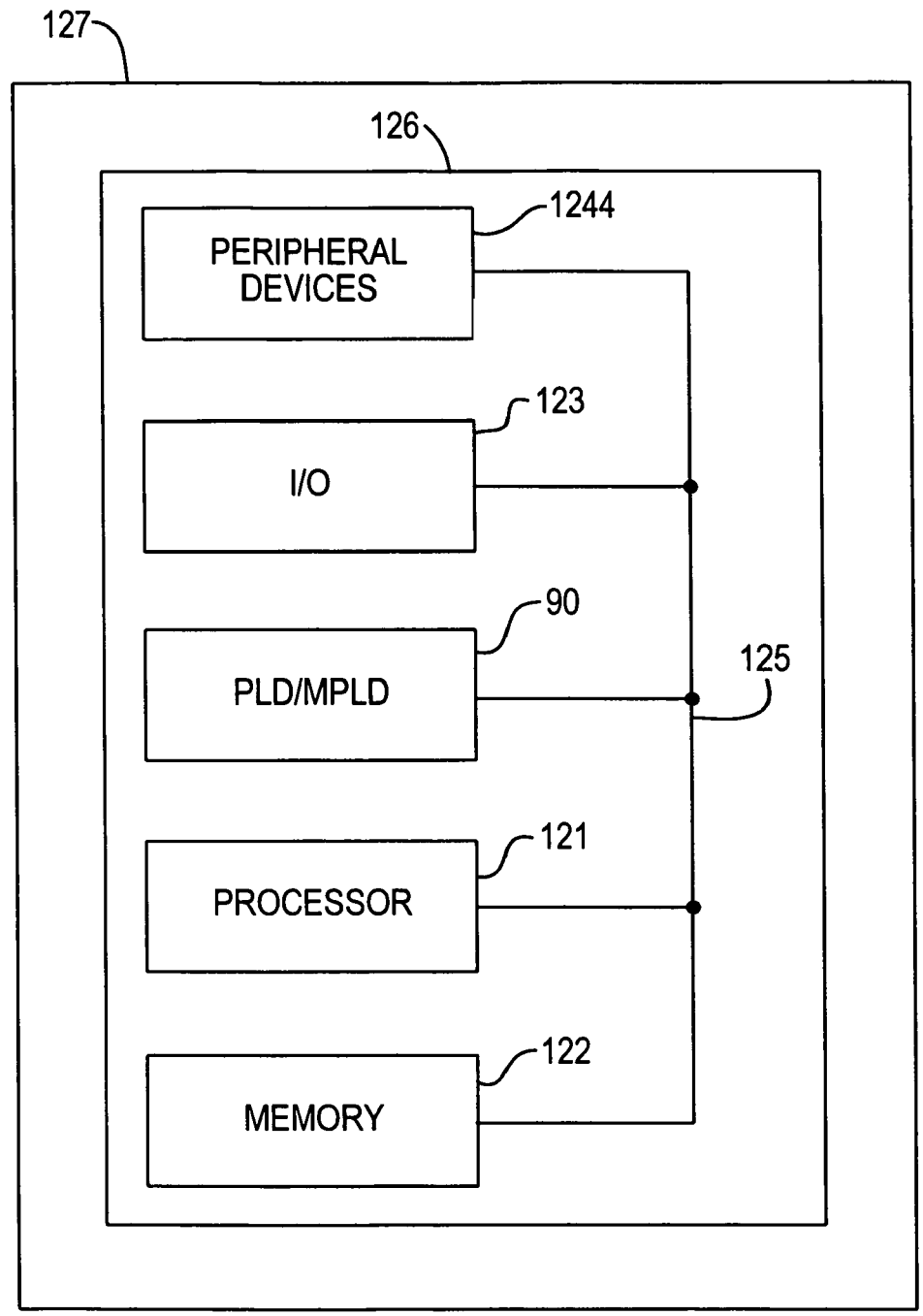
FIG. 9 is a simplified block diagram of an illustrative system employing a programmable logic device programmed in accordance with the present invention.

A PLD or MPLD 90 whose programming has been verified according to the present invention may be used in many kinds of electronic devices. One possible use is in a data processing system 120 shown in FIG. 9. Data processing system 120 may include one or more of the following components: a processor 121; memory 122; I/O circuitry 123; and peripheral devices 1244. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. PLD/MPLD 90 can be used to perform a variety of different logic functions. For example, PLD/MPLD 90 can be configured as a processor or controller that works in cooperation with processor 121. PLD/MPLD 90 may also be used as an arbiter for arbitrating access to a shared resources in system 120. In yet another example, PLD/MPLD 90 can be configured as an interface between processor 121 and one of the other components in system 120. It should be noted that system 120 is only exemplary, and that the true scope and spirit of the invention should be indicated by the following claims.

Various technologies can be used to implement PLDs/MPLDs 90 as described above and incorporating this invention.

Figure 10:
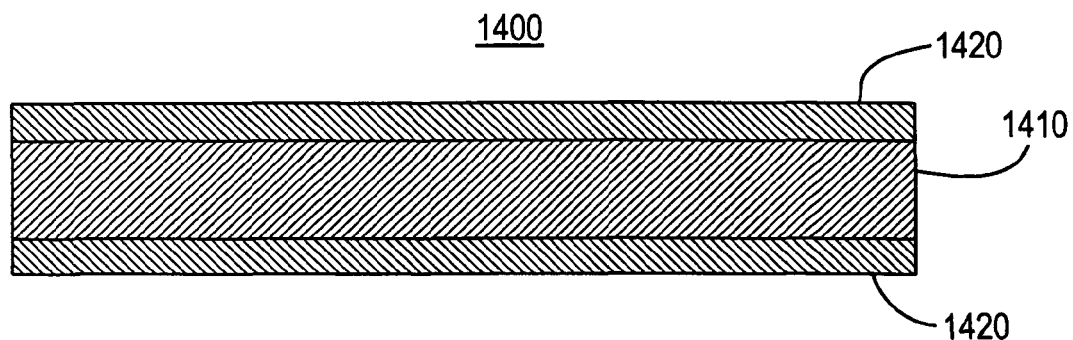
FIG. 10 is a cross-sectional view of a magnetic data storage medium encoded with a set of machine-executable instructions for performing the method according to the present invention.

FIG. 10 presents a cross section of a magnetic data storage medium 1400 which can be encoded with a machine executable program that can be carried out by systems such as system 20 of FIG. 2 to implement a method according to the invention such as method 10 of FIG. 1. Medium 1400 can be floppy diskette or hard disk, having a suitable substrate 1410, which may be conventional, and a suitable coating 1420, which may be conventional, on one or both sides, containing magnetic domains (not visible) whose polarity or orientation can be altered magnetically. Medium 1400 may also have an opening (not shown) for receiving the spindle of a disk drive or other data storage device.

The magnetic domains of coating 1420 of medium 1400 are polarized or oriented so as to encode, in manner which may be conventional, a machine-executable program such as that described above in connection with FIG. 1, for execution by systems such as system 20 of FIG. 2.

Figure 11:
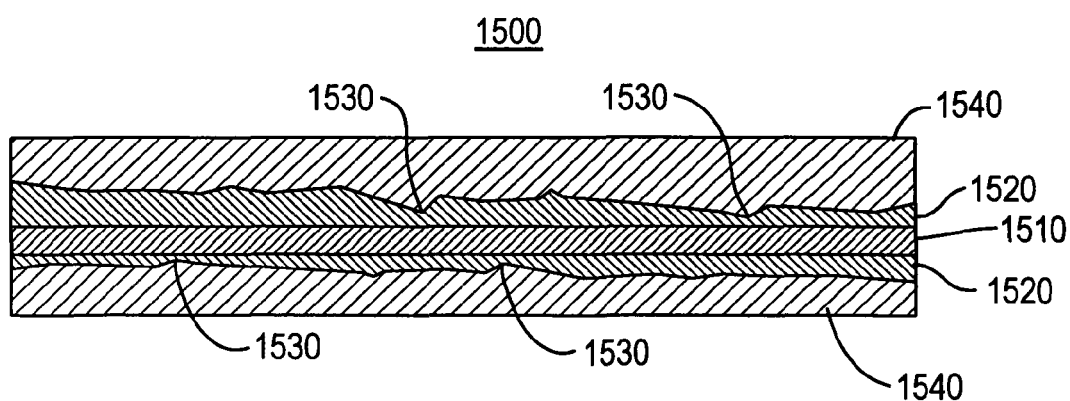
FIG. 11 is a cross-sectional view of an optically readable data storage medium encoded with a set of machine executable instructions for performing the method according to the present invention.

FIG. 11 shows a cross section of an optically-readable data storage medium 1500 which also can be encoded with such a machine-executable program, which can be carried out by systems such as system 20 of FIG. 2. Medium 1500 can be a conventional compact disk read only memory (CD-ROM) or digital video disk read only memory (DVD-ROM) or a rewriteable medium such as a CD-R, CD-RW, DVD-R, DVD-RW or DVD-RAM or a magneto-optical disk which is optically readable and magneto-optically rewriteable. Medium 1500 preferably has a suitable substrate 1510, which may be conventional, and a suitable coating 1520, which may be conventional, usually on one or both sides of substrate 1510.

In the case of a CD-based or DVD-based medium, as is well known, coating 1520 is reflective and is impressed with a plurality of pits 1530, arranged on one or more layers, to encode the machine-executable program. The arrangement of pits is read by reflecting laser light off the surface of coating 1520. A protective coating 1540, which preferably is substantially transparent, is provided on top of coating 1520.

In the case of magneto-optical disk, as is well known, coating 1520 has no pits 1530, but has a plurality of magnetic domains whose polarity or orientation can be changed magnetically when heated above a certain temperature, as by a laser (not shown). The orientation of each domain can be read by measuring the polarization of laser light reflected from coating 1520. The arrangement of the domains encodes the program as described above.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of comparing a first already-compiled programming file for a first programmable logic device to a second already-compiled programming file for a second programmable logic device different from said first programmable logic device, said method comprising:

identifying, in said first already-compiled programming file, a representation of one or more functional features of said first programmable logic device, and identifying, in said second already-compiled programming file, a representation of one or more functional features of said second programmable logic device, said second programmable logic device being different from said first programmable logic device;

establishing correspondence between one or more functional features of one programmable logic device selected from said first and second programmable logic devices, represented in one programming file selected from said first and second already-compiled programming files, and one or more functional features of another programmable logic device, selected from said first and second programmable logic devices, represented in another programming file selected from said first and second already-compiled programming files; and comparing each of one or more of said functional features of said one programmable logic device, selected from said first and second programmable logic devices, represented in said one programming file selected from said first and second already-compiled programming files, to a corresponding functional feature of said another programmable logic device selected from said first and second programmable logic devices represented in said another programming file selected from said first and second already-compiled programming files, said comparing comprising constructing binary description diagrams for each combinational logic block in a pair of combinational logic blocks to be compared, and comparing said binary description diagrams.

2. The method of claim 1 wherein said establishing correspondence comprises comparing names of functional features.

3. The method of claim 1 wherein said establishing correspondence comprises comparing locations, in said first and second programmable logic devices, of functional features.

4. The method of claim 3 wherein said comparing locations comprises comparing on-chip locations.

5. The method of claim 3 wherein said comparing locations comprises comparing package locations.

6. The method of claim 1 wherein said establishing correspondence comprises comparing connectivity of an individual functional feature of one of said one programmable logic device and said another programmable logic device selected from said first and second programmable logic devices to at least one other functional feature of said one of said one programmable logic device and said another programmable logic device selected from said first and second programmable logic devices.

7. The method of claim 6 wherein, when said at least one other functional feature comprises a plurality of said other functional features of a given type, said comparing connectivity comprises distinguishing among said plurality of said other functional features of said given type based on names of said other functional features.

8. The method of claim 1 further comprising:
identifying, in said first and second already-compiled programming files, representations of functional blocks of said first and second programmable logic devices; and
further identifying, within said representations of functional features, said representations of functional features and representations of additional said functional blocks.

9. The method of claim 8 comprising repeating said further identifying with respect to said representations of additional functional blocks until no said representations of additional functional blocks are identified within any of said representations of additional functional blocks.

10. The method of claim 1 wherein:
said one programming file selected from said first and second programming files is for a first type of programmable logic device; and
said another programming file selected from said first and second programming files is for a second type of programmable logic device.

11. The method of claim 10 wherein:
said first type of programmable logic device is a field-programmable gate array; and
said second type of programmable logic device is a mask-programmable logic device.

12. The method of claim 1 wherein said comparing representations of functional features comprises comparing representations of elements selected from the group consisting of functional elements, programming bits, internal parameters, and combinations thereof.

13. The method of claim 1 further comprising displaying results of said comparing.

14. The method of claim 13 wherein said displaying comprises displaying only results indicating differences.

15. The method of claim 14 wherein said displaying results indicating differences comprises displaying only differences beyond a predetermined tolerance.

16. The method of claim 1 wherein said comparing comprises recognizing register packing.

17. The method of claim 1 wherein said constructing comprises: partitioning said combinational logic block into a plurality of combinational logic cones; and constructing one said binary description diagram for each said combinational logic cone.

18. The method of claim 17 wherein said partitioning comprises partitioning between sequential comparison points.

19. The method of claim 18 comprising assigning common names to said sequential comparison points in said different programmable logic devices.

20. A programmable logic device programmed by a programming file that has been compared to another programming file in accordance with the method of claim 1.

21. A digital processing system comprising:
processing circuitry;
a memory coupled to said processing circuitry; and
a programmable logic device as defined in claim 20 coupled to the processing circuitry and the memory.

22. A printed circuit board on which is mounted a programmable logic device as defined in claim 20.

23. The printed circuit board defined in claim 22 further comprising:
memory circuitry mounted on the printed circuit board and coupled to the programmable logic device.

24. The printed circuit board defined in claim 23 further comprising:
processing circuitry mounted on the printed circuit board and coupled to the memory circuitry.

25. A machine-readable data storage medium encoded with machine-executable instructions for performing a method of comparing a first already-compiled programming file for a first programmable logic device to a second already-compiled programming file for a second programmable logic device different from said first programmable logic device, said instructions comprising:
instructions for identifying, in said first already-compiled programming file, a representation of one or more functional features of said first programmable logic device, and identifying, in said second already-compiled programming file, a representation of one or more functional features of said second programmable logic device, said second programmable logic device being different from said first programmable logic device;

instructions for establishing correspondence between one or more functional features of one programmable logic device, selected from said first and second programmable logic devices, represented in one programming file selected from said first and second already-compiled programming files, and one or more functional features of another programmable logic device, selected from said first and second programmable logic devices, represented in another programming file selected from said first and second already-compiled programming files; and instructions for comparing each of one or more of said functional features of said one programmable logic device, selected from said first and second programmable logic devices, represented in said one programming file selected from said first and second already-compiled programming files, to a corresponding functional feature of said another programmable logic device, selected from said first and second programmable logic devices, represented in said another programming file selected from said first and second already-compiled programming files, said instructions for comparing comprising instructions for constructing binary description diagrams for each combinational logic block in a pair of combinational logic blocks to be compared, and instructions for comparing said binary description diagrams.

26. The machine-readable data storage medium of claim 25 wherein said instructions for establishing correspondence comprise instructions for comparing names of functional features.

27. The machine-readable data storage medium of claim 25 wherein said instructions for establishing correspondence comprise instructions for comparing locations of functional features.

28. The machine-readable data storage medium of claim 27 wherein said instructions for comparing locations comprise instructions for comparing on-chip locations.

29. The machine-readable data storage medium of claim 27 wherein said instructions for comparing locations comprise instructions for comparing package locations.

30. The machine-readable data storage medium of claim 25 wherein said instructions for establishing correspondence comprise instructions for comparing connectivity of an individual functional feature of one of said one programmable logic device and said another programmable logic device selected from said first and second programmable logic devices to at least one other functional feature of said one of said one programmable logic device and said another programmable logic device selected from said first and second programmable logic devices.

31. The machine-readable data storage medium of claim 30 wherein said instructions for comparing connectivity comprise instructions for, when said at least one other functional feature comprises a plurality of said other functional features of a given type, distinguishing among said plurality of said other functional features of said given type based on names of said other functional features.

32. The machine-readable data storage medium of claim 25 wherein said instructions further comprise:

instructions for identifying, in said first and second already-compiled programming files, representations of functional blocks of said first and second programmable logic devices; and instructions for further identifying, within said representations of functional blocks, said representations of functional features and representations of additional said functional blocks.

33. The machine-readable data storage medium of claim 32 wherein said instructions comprise repeating said further identifying with respect to said representations of additional functional blocks until no said representations of additional functional blocks are identified within any of said representations of additional functional blocks.

34. The machine-readable data storage medium of claim 25 wherein, in said method:

said one programming file selected from said first and second programming files is for a first type of programmable logic device; and said another programming file selected from said first and second programming files is for a second type of programmable logic device.

35. The machine-readable data storage medium of claim 34 wherein, in said method:

said first type of programmable logic device is a field-programmable gate array; and said second type of programmable logic device is a mask-programmable logic device.

36. The machine-readable data storage medium of claim 25 wherein said instructions for comparing representations of functional features comprise instructions for comparing representations of elements selected from the group consisting of functional elements, programming bits, internal parameters, and combinations thereof.

37. The machine-readable data storage medium of claim 25 wherein said instructions further comprise instructions for displaying results of said comparing.

38. The machine-readable data storage medium of claim 37 wherein said instructions for displaying comprise instructions for displaying only results indicating differences.

39. The machine-readable data storage medium of claim 38 wherein said instructions for displaying results indicating differences comprise instructions for displaying only differences beyond a predetermined tolerance.

40. The machine-readable data storage medium of claim 25 wherein said instructions for comparing comprise instructions for recognizing register packing.

41. The machine-readable data storage medium of claim 25 wherein said instructions for constructing comprise: instructions for partitioning said combinational logic block into a plurality of combinational logic cones; and instructions for constructing one said binary description diagram for each said combinational logic cone.

42. The machine-readable data storage medium of claim 41 wherein said instructions for partitioning comprise instructions for partitioning between sequential comparison points.

43. The machine-readable data storage medium of claim 42 wherein said instructions comprise instructions for assigning common names to said sequential comparison points in said different programmable logic devices.

* * * * *